(12) United States Patent
Kher et al.

(10) Patent No.: US 10,191,787 B1
(45) Date of Patent: Jan. 29, 2019

(54) APPLICATION PROGRAM INTERFACE FOR INTERFACE COMPUTATIONS FOR MODELS OF DISPARATE TYPE

(71) Applicant: Ansys, Inc., Canonsburg, PA (US)

(72) Inventors: Sameer Kher, Mars, PA (US); Velnamby Ambalavanar, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 0 days.

(21) Appl. No.: 15/854,013

(22) Filed: Dec. 26, 2017

Related U.S. Application Data

(60) Provisional application No. 62/447,163, filed on Jan. 17, 2017.

(51) Int. Cl.
*G06F 3/00* (2006.01)
*G06F 9/54* (2006.01)
*G06F 17/50* (2006.01)

(52) U.S. Cl.
CPC ............... *G06F 9/541* (2013.01); *G06F 9/542* (2013.01); *G06F 17/5009* (2013.01); *G06F 2209/545* (2013.01)

(58) Field of Classification Search
CPC ........................................................ G06F 9/54

USPC ......................................................... 719/310
See application file for complete search history.

(56) References Cited

U.S. PATENT DOCUMENTS

| 9,152,740 | B1 * | 10/2015 | Brennan | ............ G06F 17/5009 |
| 2008/0126406 | A1 * | 5/2008 | Endabetla | ............ G06Q 10/06 |
| 2011/0087515 | A1 * | 4/2011 | Miller | .................... G06Q 10/04 |
| | | | | 705/7.26 |

OTHER PUBLICATIONS

Ashish Thusoo, Hive a Warehousing Solution Over a MapReduce Framework (Year: 2009).*

* cited by examiner

*Primary Examiner* — Lechi Truong
(74) *Attorney, Agent, or Firm* — Jones Day

(57) ABSTRACT

Systems and methods are provided herein for interfacing between a solver and one or more models. Data comprising at least one solver function is received from a solver interface. Data comprising at least one modeling function corresponding to the solver function is provided to a model interface. The presence of an event occurrence is detected based on interface functions. The interface functions are mapped to the at least one solver function and the at least one modeling function. The interface functions are provided to the solver interface to determine a solution. The solution is initiated for rendering on a graphical user interface.

20 Claims, 7 Drawing Sheets

APPLICATION PROGRAM INTERFACE FOR INTERFACE COMPUTATIONS FOR MODELS OF DISPARATE TYPE

CROSS REFERENCE TO RELATED APPLICATIONS

The present application claims priority from U.S. provisional patent application No. 62/447,163 filed Jan. 17, 2017, the entirety of which is hereby incorporated by reference.

TECHNICAL FIELD

The present disclosure relates generally to the field of application program interfaces, and, more specifically, to processor-implemented systems and methods for computations between object-oriented modeling language and hardware description language based interfaces.

BACKGROUND

Physical environment modeling can be useful in the various engineering efforts involved in developing or testing of a particular product. Behavioral models exist for modeling different physical environments. Behavioral models help to analyze a system's response to different variables, such as external forces. Consider, for example, a complex system such as a car. A car includes many different components some of which may be electrical, such as tire pressure sensors, and others that may be mechanical, such as a set of tires.

A simulation environment can be selected based upon the types of components used within a system (e.g., electrical or mechanical). Some simulation environments contain behavioral models that are tailored to characterizing physical systems with mechanical components, such as an object-oriented modeling language based model. For example, an object-oriented modeling language based model can help with analyzing how a car's tires react to traveling on a bumpy road. The model can consider various physical forces, among other behavior, associated with the bumpy road and impacts to the overall car.

Other simulation environments have behavioral models that are more tailored to electrical components. A hardware description language based model, for example, can be useful for modeling electrical components where analog and digital signal behaviors are of interest. These electrical signals of interest in a car, for example, can result from the tire pressure sensor detecting a change in tire pressure while traveling on the bumpy road.

There may also be instances where the use of two different behavioral models in a single environment is desired. For example, it is undesirable for tire pressure alarms to go off after the car hits a bump in the road. During initial design or troubleshooting, analysts may want a single simulation environment that allows for characterization of both physical force modeling of the tire as well as electrical signal modeling of the pressure sensor. As noted above, the physical system impacts may be best modeled with an object-oriented modeling language based model, and the electrical system impacts may be best modeled with a hardware description language based model. Using different behavioral models together in a single environment, however, can present compatibility issues due to different programming interfaces.

SUMMARY

In one aspect, data comprising at least one solver function is received from a solver interface. Data comprising at least one modeling function corresponding to the solver function is provided to a model interface. The presence of an event occurrence is detected based on interface functions. The interface functions are mapped to the at least one solver function and the at least one modeling function. The interface functions are provided to the solver interface to determine a solution. The solution is initiated for rendering on a graphical user interface. In an interrelated embodiment, a model interface is an interface of a model of a physical object that interacts with other physical objects within a system. The model may be generated based on observation of a physical object or by generating a model according to a design of a new physical object. In other interrelated embodiments, a physical object is created or modified based on the solution.

In another interrelated aspect, systems can be provided for implementing various operations that include at least one data processor and memory. Such systems can include a simulation environment. Memory storing instructions can be stored within the memory. Execution of the memory storage instructions results in operations comprising receiving data including at least one solver function from a solver interface. Data comprising at least one modeling function corresponding to the solver function is provided to a model interface. The presence of an event occurrence is detected based on interface functions. The interface functions are mapped to the at least one solver function and the at least one modeling function. The interface functions are provided to the solver interface to determine a solution. The solution is initiated for rendering on a graphical user interface. In an interrelated embodiment, a model interface is an interface of a model of a physical object that interacts with other physical objects within a system. The model may be generated based on observation of a physical object or by generating a model according to a design of a new physical object. In other interrelated embodiments, a physical object is created or modified based on the solution.

In yet another interrelated aspect, an article of manufacture can include memory storing instructions, which when executed, result in various operations. The operations include receiving data comprising at least one solver function from a solver interface. Data comprising at least one modeling function corresponding to the solver function is provided to a model interface. The presence of an event occurrence is detected based on interface functions. The interface functions are mapped to the at least one solver function and the at least one modeling function. The interface functions are provided to the solver interface to determine a solution. The solution is initiated for rendering on a graphical user interface. In an interrelated embodiment, a model interface is an interface of a model of a physical object that interacts with other physical objects within a system. The model may be generated based on observation of a physical object or by generating a model according to a design of a new physical object. In other interrelated embodiments, a physical object is created or modified based on the solution.

Non-transitory computer program products (i.e., physically embodied computer program products) are also described that store instructions, which when executed by one or more data processors of one or more computing systems, cause at least one data processor to perform operations herein. Similarly, computer systems are also described that can include one or more data processors and memory coupled to the one or more data processors. The memory can temporarily or permanently store instructions that cause at least one processor to perform one or more of the operations described herein. In addition, methods can be implemented by one or more data processors either within a single computing system or distributed among two or more computing systems. Such computing systems can be connected and can exchange data or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides an ability to perform a system level simulation within a single environment using both an object-oriented modeling language based interface and a hardware description language based interface while, at the same time, reducing computer resource computations and providing more efficient modeling.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

Like reference symbols in the various drawings indicate like elements.

DETAILED DESCRIPTION

As noted above, simulations using multiple models of differing types, while desirable, can result in compatibility issues when, for example, modeling a physical real world object as a virtual model in virtual environments. Natively supporting multiple simulation models or solvers, such as object-oriented modeling language based models and hardware description language based models, can ease a system level simulation in a single environment. An application programming interface (API) is an intermediary layer that can provide compatibility between each model and a solver application. The methods, systems, and devices described herein provide for an API that performs a simulation of a physical system. A physical system may, for example, be a collection of virtual object models of real world physical objects that operate in a coordinated manner to realize a physical objective. Within a simulation of such a physical system, the virtual objects interact in a coordinated manner within a virtual environment model of a real world environment that subjects the real world physical objects to various physical forces when realizing such a physical objective. Modelling a physical object and simulating its behavior in a virtual environment entails performing one or more simulations based on the virtual environment, simulation conditions, and a desired result. According to the simulation employed one or more specific solver functions must be employed.

The physical system includes models of different types having respective object-oriented modeling language based interfaces or hardware description language based interfaces. The physical systems can include, for example, integrated circuits having analog signals, digital signals, or a combination of analog and digital signals. Alternatively, the physical systems can be systems containing mechanical, electrical, hydraulic, thermal, or controller components. Exemplary models described herein utilize heuristics for the integration of a solver and one or more models into a single environment.

Figure 1:
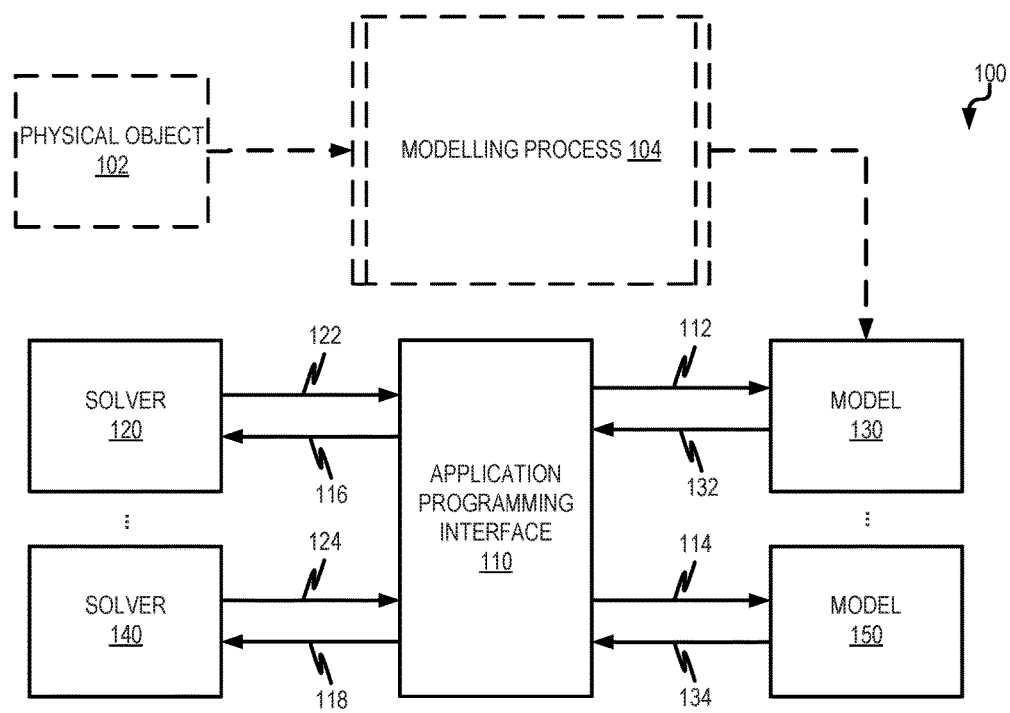
FIG. 1 is an example block diagram of an application programming interface (API) integrating between one or more solvers and one or more models into a single environment.

FIG. 1 is an example block diagram 100 of an API 110 integrating between one or more solvers 120, 140 and one or more models 130, 150 into a single environment. Model 130 may be a virtual model of various aspects of one or more physical objects such as a physical object 102, and may be generated through modelling process 104 by observing a physical object 102 and creating a virtual object model 130 of the physical object 102 using any suitable design platform, for example ANSYS engineering simulators. Model 130 may be generated in part by obtaining physical characteristics of a physical object 102 by measuring and testing the physical properties of a physical object 102 (e.g. currents, voltages, dimensions, weights, pressures, routing, interfaces). Alternatively through modelling process 104, a model may be generated according to a design of a new physical object that has never before been physically realized. In this way, the new physical object may, in one of many examples, be employed and evaluated in various design simulations. By utilizing a new physical object in design simulations before expending time and resources to create a physical realization of the new physical object, the virtual object may be tailored and modified in a virtual environment to fit the needs and demands of a larger system of physical objects that the new physical object is intended to interact with. In this way simulators in accordance with this disclosure are able to substantially reduce the cost and resources needed to design a new physical object. Similarly, by modeling a physical object 102 proposed design changes to object 102 may be simulated in various virtual environments in order to evaluate how the physical object 102 will perform in various physical environments after modifications have been to physical object 102. In this way simulators in accordance with this disclosure are able to substantially reduce the cost and resources needed to modify a physical object 102 according to, for example, a design change.

API 110 can be an intermediary layer between one or more models 130, 150 and one or more solvers 120, 140. API 110 interprets inputs received from one or more models 130, 150 or one or more solvers 120, 140. API 110 maps inputs to outputs based on which solver or model will receive the output. Each model 130, 150 can potentially be of different simulation types. For example, model 130 can be an object-oriented modeling language based model and model 150 can be a hardware description language based model. Models of different types can have different model interfaces that define the model's inputs and outputs. The differences in model interfaces may be due, in part, to different coding platforms or compliers used for the models. The different interfaces can contribute to compatibility issues associated with the models 130, 150 or solvers 120, 140 interfacing together in absence of API 110. Solvers 120, 140 can also be of different types. For example, solver 120 can be an analog solver and solver 140 can be an external integrator. Selection of which particular solver to use for a given system can be made by the API 110 based upon the system behavior exhibited by one or more models 130, 150 during a simulation of how a physical object, e.g. 102, behaves in the real world. API 110 can interpret inputs 132, 134 received from models 130, 150 and provide an output 116 to solver 120, for example, in a format compatible with the interface of solver 120. Output 116 can incorporate relevant information from inputs 132, 134 that solver 120 uses in its computations.

API 110 interfaces with one or more models 130, 150. A virtual object model, e.g., 130 can accept inputs 112 from API 110 that are different from inputs 114 to model 150, where model 150 is different than model 130. Similarly, the outputs of each model 130, 150 can also differ. Model 130 can provide outputs 132 to API 110 that can be of a different format or content than outputs 134 from model 150.

API 110 can also interface with one or more solvers 120, 140 in order to simulated specific aspects of how a physical object based on model 130, 150 will behave in the real world. API 110 can determine based on inputs received from the model 130 (i.e., inputs 132, 134) which solver 120 to use for performing computations. Similar to models 130, 150, each solver 120, 140 can have individual interfaces that may not be compatible with the interfaces of each of the models 130, 150 with which the solver is communicating. Solver 120 can accept inputs 116 from API 110 that differ from inputs 118 to a solver 140. Solver 120 can also provide outputs 122 to API 110 that differ from the outputs 124 of solver 140.

To solve equations associated with the modeled system, a solver 120 or 140 may require additional information from a model 130 or 150. For example, solver 120 can request additional information via the API 110 as indicated at 122. API 110 maps this information request into a format compatible with the model with which solver 120 is currently working (e.g., model 130) and outputs the mapped request (e.g., to model 130 at 112). In another example, solver 120 may require a combination of information from both models 130, 150. In this example, API 110 maps the request from solver 120 into two different formats, one which is compatible with model 130 at 112 and another which is compatible with model 150 at 114. API 110 receives this information from both model 130, 150 at 132 and 134, respectively. Since the model interfaces provide information in different formats, API 110 maps this information into a format compatible with solver 120. API 110 then provides this information to solver 120 at 116.

Figure 2:
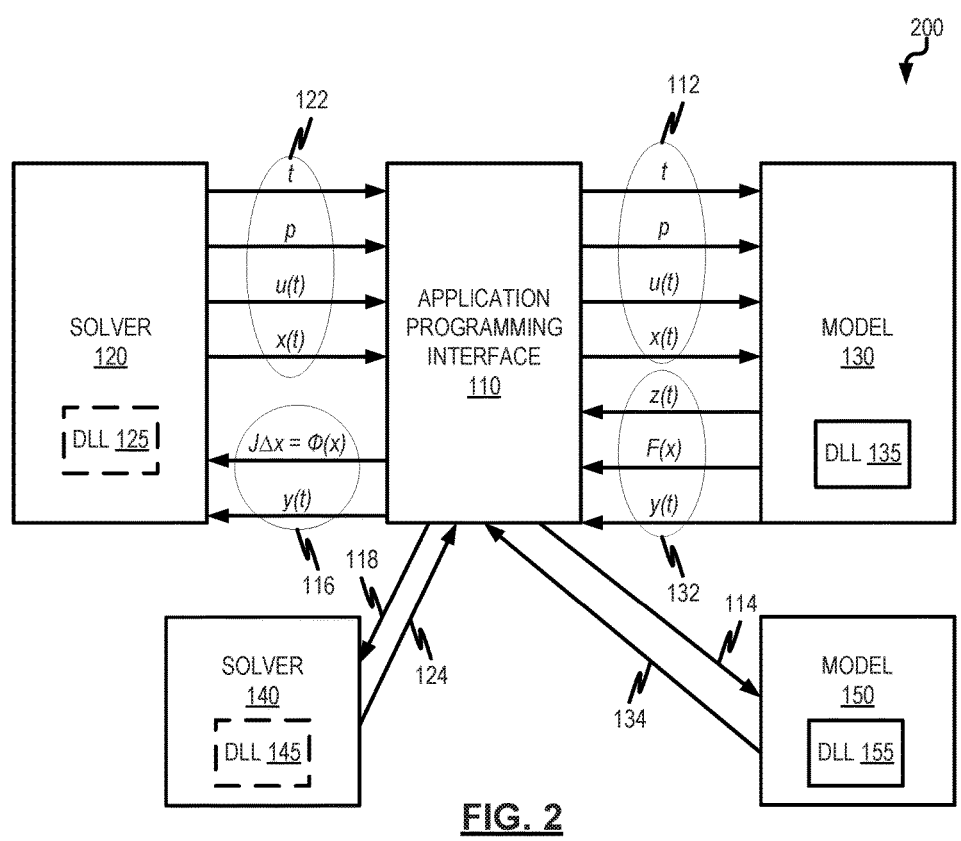
FIG. 2 is an example block diagram for an API that allows for one or more solvers to interface with one or more models in a single environment.

FIG. 2 is an example block diagram 200 for an API 110 that allows for one or more solvers 120, 140 to interface with one or more models 130, 150 in a single environment. Models 130, 150 can utilize, for example, an object-oriented modeling language based interface or a hardware description based model interface. Due to potentially different interfaces between one or more models 130, 150, mapping is performed by API 110 to provide for compatibility of the one or more models 130, 150 with each other as well as with one or more solvers 120, 140. For example, model 130 and solver 120 can have a connection that is either conservative or non-conservative. The connection, whether conservative or non-conservative, can require mapping of inputs and outputs such that each interface of model 130 or solver 120 receives functions in its native format.

Conservative connections represent physical connections (i.e., electrical wires or mechanical ports) and involve both flow and potential quantities at the same time. Due to its physical connections, conservative connections provide tight integrations with other physical system models. Conservative connections are more stable numerically and provide for more accurate results.

Non-conservative connections represent a non-physical connection between model interfaces, where the value of one signal is connected to another in a mathematical sense. Non-conservative connections are commonly used interfaces by various models. API 110 can provide mapping for both conservative and non-conservative connections in order to provide for compatibility of models having disparate interface types. A non-conservative connection, for example, can have N interface points. Each interface port can have, for example, an assigned pair such as $\{i_k, v_k\}$ where k ranges from 1 to N, $i_k$ represents a flow quantity, and $v_k$ represents a potential quantity. In the pair of $\{i_k, v_k\}$, these quantities can be defined as either an input or an output port type. If one is defined as an input quantity, the other one would be defined as an output quantity.

Equations representing non-conservative connections, for example, can be formed such that the inputs and outputs form part of a solution vector. A Kirchoff's Current Law formulation for each port, k, adds a value of '1' to the corresponding column of a Jacobian matrix to represent a flow quantity, $i_k$, entering port k. The relationship between inputs and outputs of the non-conservative connection can be formulated such that:

$$\vec{f}(x) - \vec{y} = 0 \qquad (1)$$

where $\vec{f}$ is a vector function representing the output value of a model associated with input quantities for vector x, and $\vec{y}$ is the solution vector representing output quantities. Using an analog solver, for example, using a Newton-Raphson method, the Equation (1) can be solved as follows:

$$\begin{bmatrix} \frac{\partial f_1}{\partial x_1} & \cdots & \frac{\partial f_1}{\partial x_N} \\ \vdots & \ddots & \vdots \\ \frac{\partial f_N}{\partial x_1} & \cdots & \frac{\partial f_N}{\partial x_N} \end{bmatrix} \begin{bmatrix} \Delta x_1 \\ \vdots \\ \Delta x_N \end{bmatrix} - \begin{bmatrix} \Delta y_1 \\ \vdots \\ \Delta y_N \end{bmatrix} = - \begin{bmatrix} f_1(\hat{x}_1, \ldots, \hat{x}_N) - \hat{y}_1 \\ \vdots \\ f_N(\hat{x}_1, \ldots, \hat{x}_N) - \hat{y}_N \end{bmatrix} \qquad (2)$$

where $\hat{x}_k$ and $\hat{y}_k$ are predicted values for the first iteration or corrected values, if the iteration is greater than the first iteration, computed at the previous iteration, $$x_k = \hat{x}_k + \Delta x_k, \text{ and} \qquad (3)$$

$$y_k = \hat{y}_k + \Delta y_k. \qquad (4)$$

API 110 downloads a respective dynamic link library (DLL) 135, 155 associated with each of the one or more models 130, 150. The DLL is a shared library for each of the models 130, 150 that defines functions or data that can be utilized by the API 110. Equations are formulated within solver 120 based on the DLL corresponding to the one or more models 130, 150. API 110 receives various input functions 132, 134 from one or more models 130, 150. For model 130 that is an object-oriented modeling language based model, inputs 132 can include event indications, z(t), state derivatives, ẋ(t), and outputs, y(t). Similarly, for an object-oriented modeling language based model, API 110 provides various outputs 112 that can include time, t, parameters, p, inputs, u(t), and states x(t).

Each solver 120, 140 can also have an associated DLL 125, 145 defining the functions or data, which can be utilized or provided by API 110 during simulations of physical behavior in a virtual object model of a physical object, e.g. 102. In some cases, the API 110 may belong to the same application layer as a solver. For example, solver 120 may belong to the same application layer as API 110, in which case DLL 125 may not be necessary. For solver 120 that is, for example, an analog solver, various input functions 122 that the API 110 receives from solver 120 can include, for example, time, t, parameters, p, inputs, u(t), and states, x(t). API 110 can output various output functions 116 to solver 120 can include, for example, Jacobian matrix, J, and outputs, y(t). For a hardware description language based model of a physical object, for example an electronic circuit implemented in a semiconductor chip, API 110 can also receive inputs 134 from model 150 and provide outputs 114 to model 150.

Solver 120 can be, for example, a differential algebraic equation solver. Alternatively, solver 140 can be, for example, an external integrator. An external integrator can be used if the system being modeled is a stiff system. A stiff system is a system where solutions to a system of Differential Algebraic Equations (DAEs) vary rapidly between computation iterations. An external integrator can be switched in by API 110, in which case API 110 receives inputs 124. Solver 140, being an external integrator solver, can receive outputs 118 from API 110 if the API 110 determines the modeled system is a stiff system. One or more solvers 120, 140 can be activated numerous times during a simulation including (i) at a start of a simulation, (ii) after an event update, (iii) after more than a predetermined number of steps have occurred since the last event occurrence detection (i.e., after 40 steps), (iv) if the solution has a convergence failure, or (v) if the solution is divergent.

Figure 3:
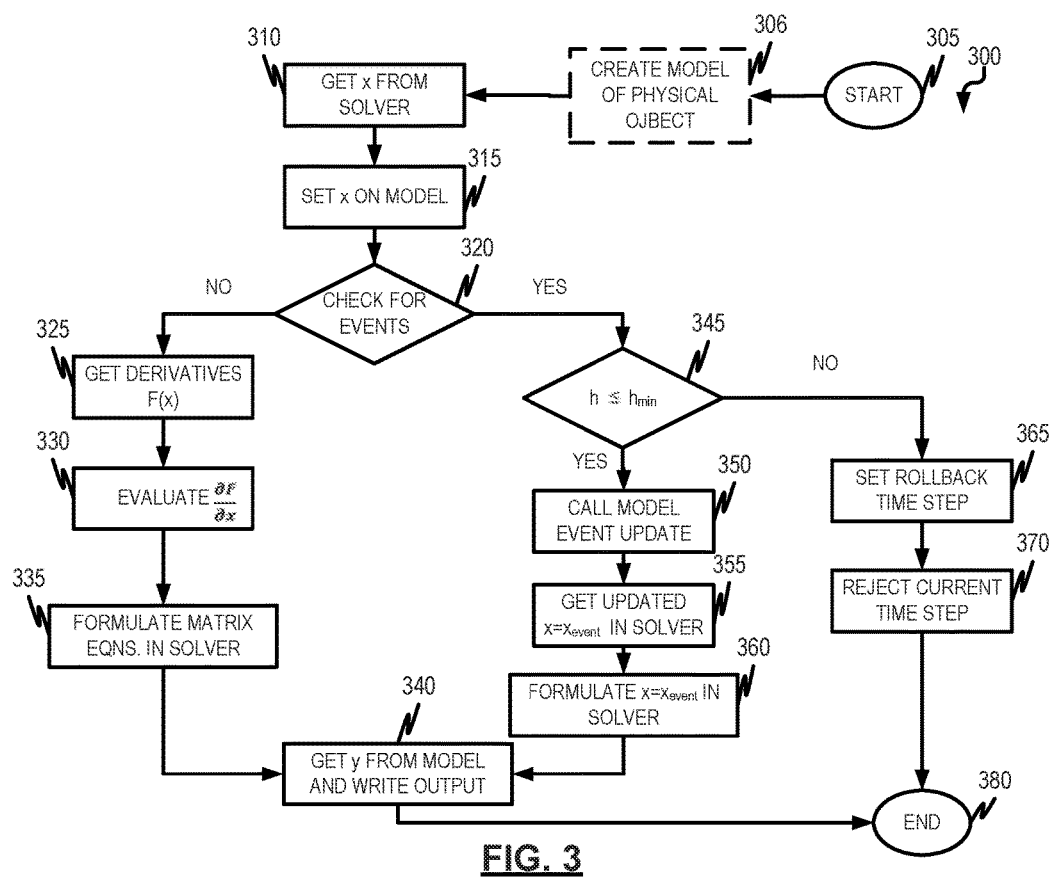
FIG. 3 is an example flow diagram for a single computation iteration associated with a simulation.

FIG. 3 is an example flow diagram 300 for a single computation iteration associated with a simulation. The iterations start, at 305, for a single computation iteration. If a virtual object model has not yet been created of a physical object, e.g. 102, or from a design of a new physical object, first a virtual object model is created at 306 as discussed above. Alternatively, if a model has already been created, it may be retrieved or accessed. Based on the physical behavior in a physical object, e.g. 102, modeled by the virtual object model, e.g. 130, being modelled, API 110 requests solver functions, at 310, from solver 120. The solver functions are mapped using the mapping as described herein. Model functions are then set, at 315, to model 130 in a format native to model 130.

An event occurrence is checked, at 320, by API 110 to determine whether certain event types have occurred. These events include time events, state events, or step events in the data. Time events are explicitly defined prior to the simulation. For example, these can be predetermined by a user. Solver 120 uses a time trigger mechanism to hit an event time point precisely. State events occur when there is a discontinuity in continuous states of a function. A state event is detected based on sign changes associated with the event indicator function, z(t). If a sign change occurs within event indication function, z(t), solver 120 estimates a zero crossing point and rolls back to a smaller step size, h. Step events are detected based on a dynamic state selection when the computed state is no longer numerically suitable. The dynamic state selection can be performed using a Functional Mock-up Interface (FMI) standard.

If an event is not detected, state derivatives, ẋ(t), are received, at 325, by API 110 from model 130 and provided to solver 120. If solver 120 is, for example, an Ordinary Differential Equations (ODE) solver, the Jacobian matrix $$\frac{\partial F}{\partial x},$$

is evaluated, at 330, using a finite difference method. For example, solver 120 can be an ODE solver used to solve:

$$\vec{\phi}(x) \equiv \dot{\vec{x}} - \vec{F}(x) = 0 \quad (5)$$

where $\vec{\phi}(x)$ is the residual vector, $\vec{F}$ is the derivative vector computed by model 230, and is the derivative vector computed by the solver using discretization. Discretizing using a numerical integration scheme (i.e., trapezoidal method) results in:

$$\vec{\phi}(\vec{x}_{k+1}) \equiv \left[\frac{2}{h}(\vec{x}_{k+1} - \vec{x}_k) - \dot{\vec{x}}_k\right] - \vec{F}(\vec{x}_{k+1}) = 0 \quad (6)$$

where k is the time step and h is the step size. Solving Equation (6) using a Newton iteration results in:

where $\Delta\vec{x}$ is the derivative state matrix, and i is the Newton iteration. A Jacobian matrix equation can be formulated, at 335, as follows:

$$\vec{J} = \frac{2}{h} \cdot \vec{I} - \frac{\partial \vec{F}}{\partial \vec{x}} \quad (8)$$

where $\vec{J}$ is the Jacobian matrix, $\vec{I}$ is an identify matrix of dimensions corresponding to the Jacobian, $$\frac{\partial \vec{F}}{\partial \vec{x}},$$

and h is the step size.

Alternatively, if an event is detected, at 320, the current step size, h, is evaluated, at 345, against a minimum step size, $h_{min}$. If the current step size, h, is less than or equal to the minimum step size, $h_{min}$, solver 120 calls, at 350, an event update function of model 130. API 110 provides this mapped request to model 130. API 110 obtains, at 355, new states, x(t), from solver 120. Solver 120 formulates, at 360, a new Jacobian based on the updated function states.

After either the formation of the Jacobian matrix, at 335, or the using new states to form a Jacobian matrix, at 360, an output, y(t), is obtained, at 340, from the model 130. API 110 initiates rendering of this output on a graphical user interface ending the iteration, at the iteration end 380.

If an event is detected, at 320, and the current step size, h, is greater than the minimum step size, $h_{min}$, at 345, the step size, h, is rolled back to a smaller step size, at 365. The current settings related to that step size are rejected, at 370, ending the iteration, at iteration end 380.

Figure 4:
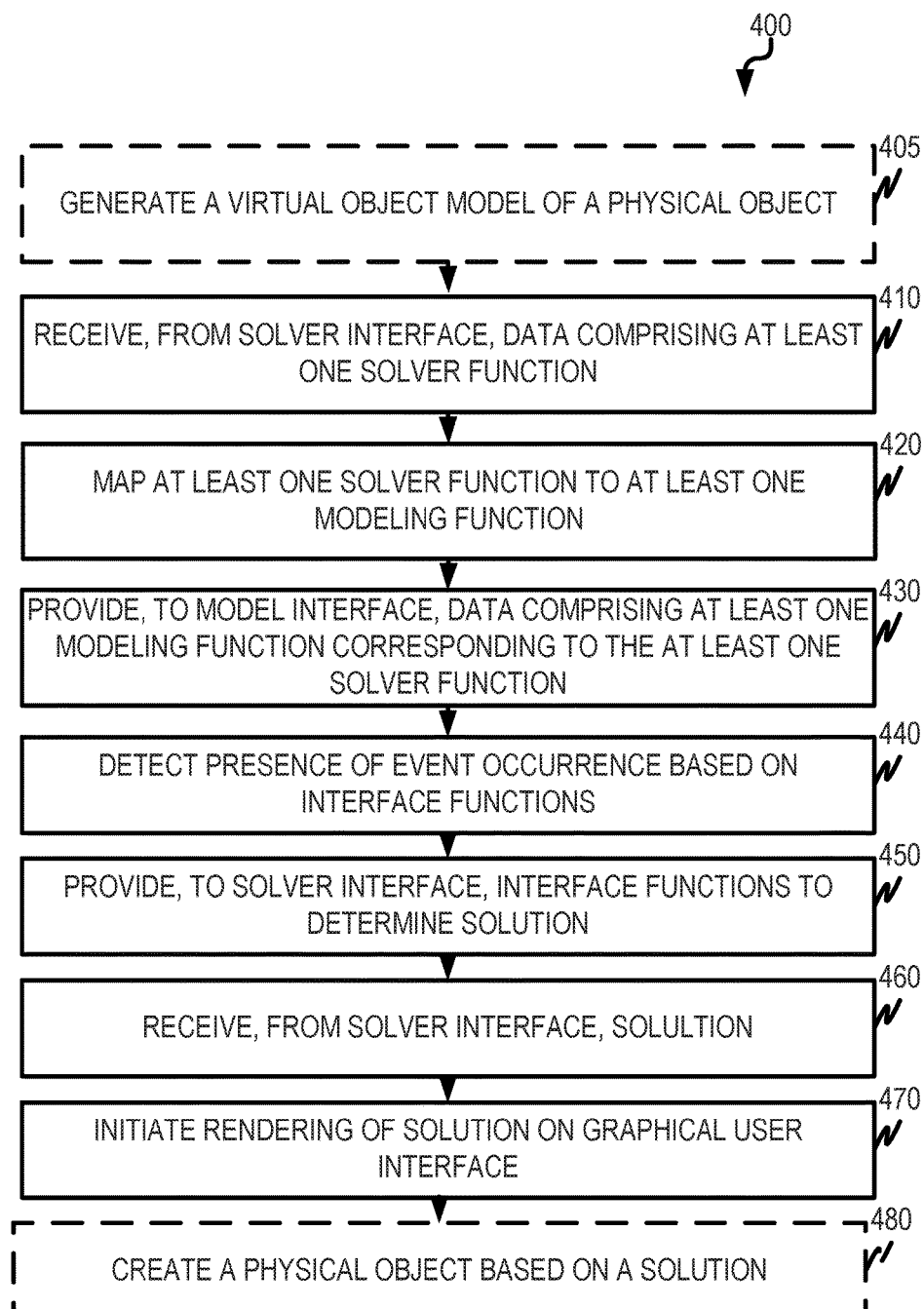
FIG. 4 is an example process flow diagram for an API.

FIG. 4 is an example process flow diagram 400 for an API. A virtual object model of a physical object, or of an aspect of a physical object, e.g. 102, is created at operation 405 in order to simulate the physical behavior of the physical object in a virtual environment. Data comprising at least one solver function is received, at 410, from a solver interface (i.e., from one or more solvers 120, 140). The at least one solver function is mapped, at 420, to at least one modeling function. Data comprising at least one modeling function corresponding to the at least one solver function is provided, at 430, to a model interface (i.e., one or more models 130, 150). The presence of an event occurrence is detected, at 440, based on interface functions. The interface functions are mapped to the at least one solver function and the at least one modeling function. The interface functions are provided, at 450, to the solver interface to determine a solution. A solution is received, at 460, from the solver interface. Rendering of the solution on a graphical user interface is initiated, at 470. Based on the solution, one or more design changes may be made to the model, and a physical object is created or modified at 480.

Figure 5:
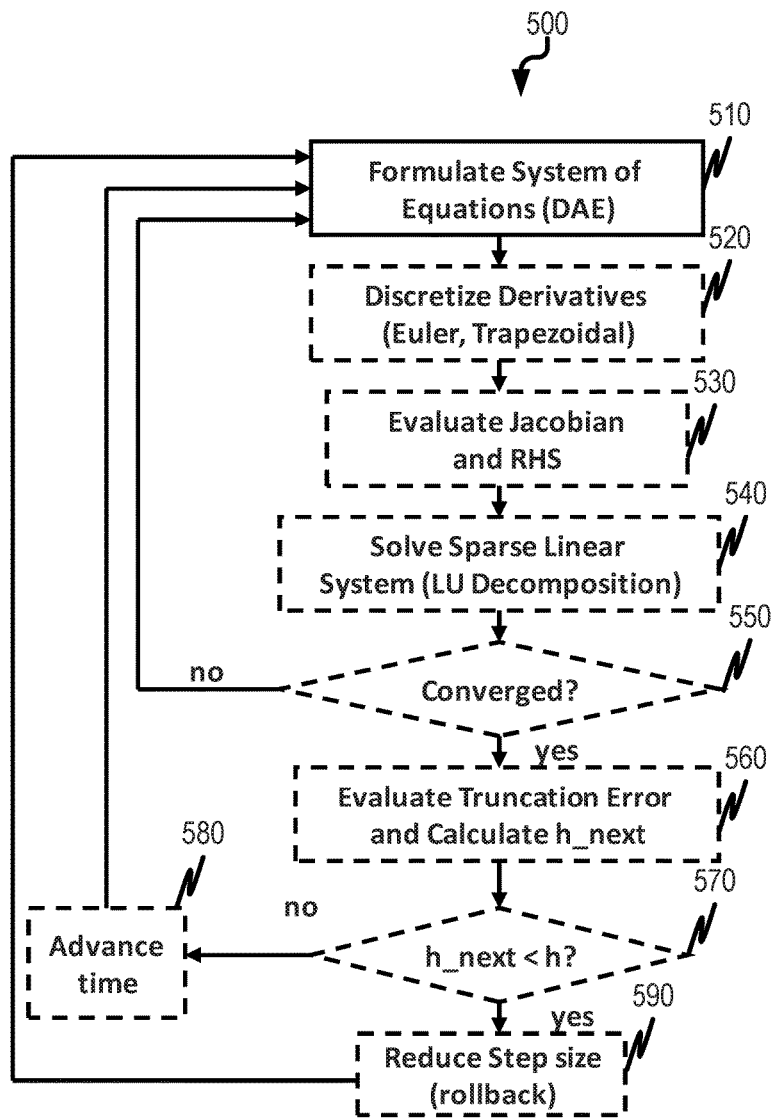
FIG. 5 is an example process flow diagram for a Differential Algebraic Equations (DAE) solver in the form of an analog solver.

Solver 120 can take a variety of forms. For example, FIG. 5 is an example process flow diagram 500 for a solver 120 in the form of an analog DAE solver. An analog solver can be applied in a variety of different contexts. For example, an analog solver is useful in a model that has non-linear relations between potential and flow quantities, implicit flow conservation laws, or relationships between non-conservative quantities. A system of DAEs is formulated, at 510, for a system being modeled. Discrete derivatives are computed, at 520, using, for example, an Euler or trapezoidal solving approach. Based on the discrete derivatives, the Jacobian and right-hand side (RHS) evaluations are performed, at 530, to solve the system of DAEs. Using a lower upper (LU) decomposition, the sparse linear system is solved, at 540. Solution convergence is evaluated, at 550. If the solution has not yet converged, the system of DAEs is re-formulated at 510. If the solution has converged, the truncation error and the next step size, $h_{next}$, are calculated, at 560. The calculated next step size, $h_{next}$, is evaluated, at 570, against the current step size, h. If the next step size, $h_{next}$, is less than the current step size, h, then the step size is advanced, at 580, and the process returns to the system of DAEs formulation, at 510. However, if the next step size, $h_{next}$, is more than the current step size, h, the step size is reduced (i.e., rolled back), at 590, before returning to the equation formulation step 510.

Simulation models can be expressed by a system of arbitrary DAEs. Typically, a compiler coverts the system of DAEs into a state-space form. The equations can be solved using, for example, numerical integration. Numerical integration, such as implicit numerical integration or iterative integration using Newton's method, can provide solutions for the system of DAEs. Non-linear simulation models, such as KINSOL, can be used to carry out the numerical integration.

Figure 6:
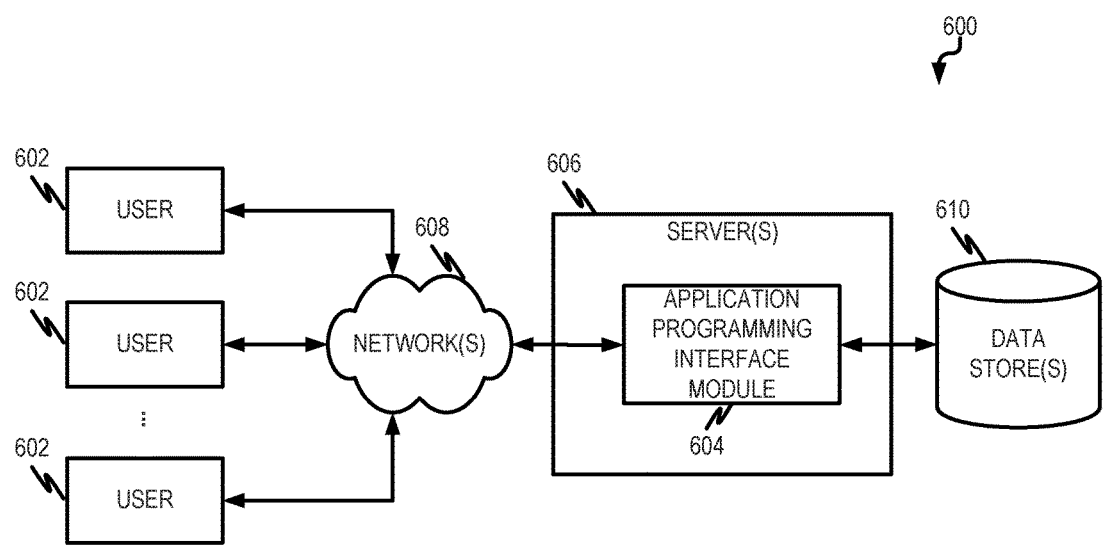
FIG. 6 is an example computer-implemented environment.

FIG. 6 is an example computer-implemented environment 600 wherein users 602 can interact with an API module 604 hosted on one or more servers 606 through a network 608. The API module 604 can assist the users 602 with interfacing between an object-oriented modeling language based interface and a hardware description language based interface.

As shown in FIG. 6, the users 602 can interact with the API module 604 through a number of ways, such as over one or more networks 608. One or more servers 606 accessible through the network(s) 608 can host the API module 604. The one or more servers 606 can also contain or have access to one or more data stores 610 for storing data for the API module 604.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, can include machine instructions for a programmable processor, and/or can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, solid-state storage devices, memory, and Programmable Logic Devices (PLDs), used to provide machine instructions and/or data to a programmable data processor, including a machine-readable medium that receives machine instructions as a computer-readable signal. The term "computer-readable signal" refers to any signal used to provide machine instructions and/or data to a programmable data processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

The computer components, software modules, functions, data stores and data structures described herein can be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality can be located on a single computer or distributed across multiple computers depending upon the situation at hand.

Figure 7:
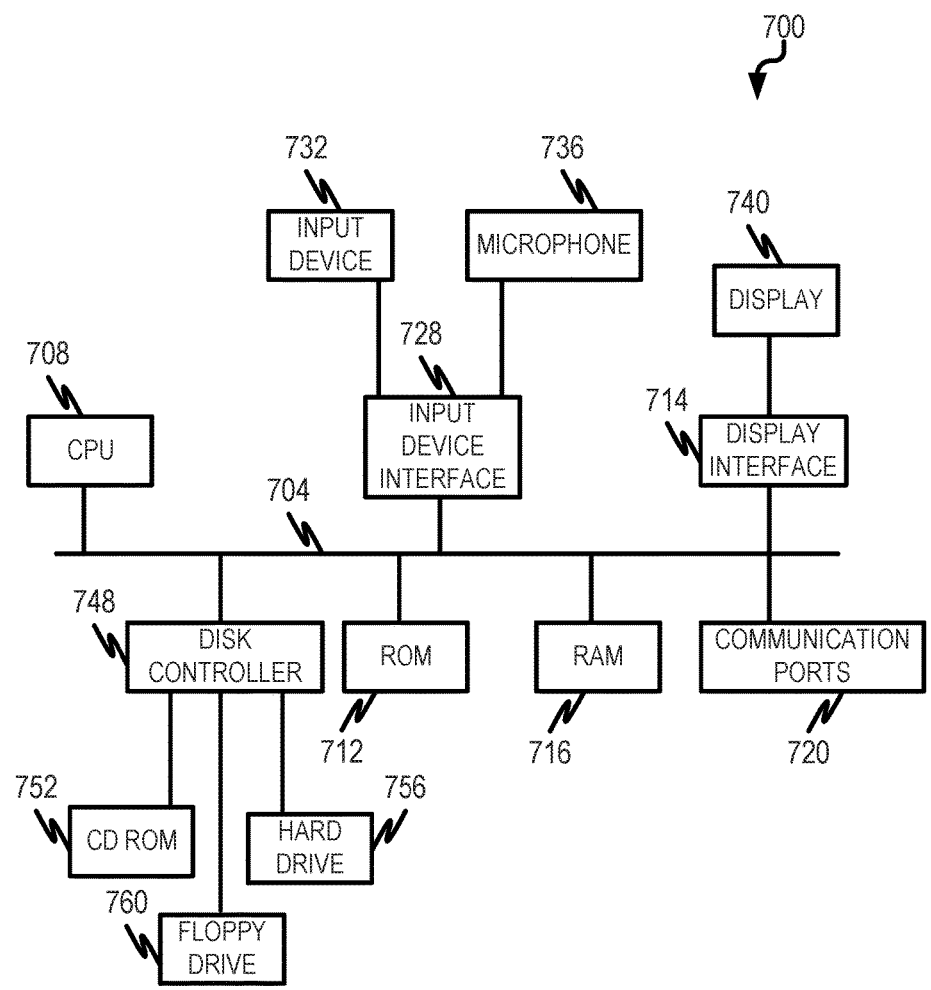
FIG. 7 is a diagram illustrating a sample computing device architecture for implementing various aspects described herein.

FIG. 7 is a diagram 700 illustrating a sample computing device architecture for implementing various aspects described herein. A bus 704 can serve as the information highway interconnecting the other illustrated components of the hardware. A processing system 708 labeled CPU (central processing unit) (e.g., one or more computer processors/data processors at a given computer or at multiple computers), can perform calculations and logic operations required to execute a program. A non-transitory processor-readable storage medium, such as read only memory (ROM) 712 and random access memory (RAM) 716, can be in communication with the processing system 708 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 748 can interface one or more optional disk drives to the system bus 704. These disk drives can be external or internal floppy disk drives such as 760, external or internal CD-ROM, CD-R, CD-RW or DVD, or solid state drives such as 752, or external or internal hard drives 756. As indicated previously, these various disk drives 752, 756, 760 and disk controllers are optional devices. The system bus 704 can also include at least one communication port 720 to allow for communication with external devices either physically connected to the computing system or available externally through a wired or wireless network. In some cases, the communication port 720 includes or otherwise comprises a network interface.

To provide for interaction with a user, the subject matter described herein can be implemented on a computing device having a display device 740 (e.g., a CRT (cathode ray tube) or LCD (liquid crystal display) monitor) for displaying information obtained from the bus 704 to the user and an input device 732 such as keyboard and/or a pointing device (e.g., a mouse or a trackball) and/or a touchscreen by which the user can provide input to the computer. Other kinds of input devices 732 can be used to provide for interaction with a user as well; for example, feedback provided to the user can be any form of sensory feedback (e.g., visual feedback, auditory feedback by way of a microphone 736, or tactile feedback); and input from the user can be received in any form, including acoustic, speech, or tactile input. In the input device 732 and the microphone 736 can be coupled to and convey information via the bus 704 by way of an input device interface 728. Other computing devices, such as dedicated servers, can omit one or more of the display 740 and display interface 714, the input device 732, the microphone 736, and input device interface 728.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

The invention claimed is:

1. A computer-implemented method for performing a simulation of a physical system by interfacing between a model interface of a physical system and a solver interface of a solver model, the method comprising:

accessing a virtual object model of a physical object, the virtual object model having the model interface;

receiving, from a solver interface, data comprising at least one solver function;

mapping the at least one solver function to at least one modeling function;

providing, to a model interface, data comprising the at least one modeling function corresponding to the at least one solver function;

detecting a presence of an event occurrence based on a plurality of interface functions, wherein the plurality of interface functions are mapped to the at least one solver function and the at least one modeling function;

providing, to the solver interface, the plurality of interface functions to determine a solution;

receiving, from the solver interface, the solution;

initiating rendering of the solution on a graphical user interface; and creating or modify the physical object based at least in part on the solution.

2. The method according to claim 1, wherein the physical system modeled by the model interface is either (i) an integrated circuit having at least one of an analog signal and a digital signal or (ii) a complex system having at least one of a mechanical subcomponent, an electrical subcomponent, a hydraulic subcomponent, a thermal subcomponent, or a controller subcomponent.

3. The method according to claim 1, wherein the event occurrence is a time event determined based on a predetermined time event point.

4. The method according to claim 1, wherein the event occurrence is a state event detected based on signal discontinuity of continuous states signaled by a sign change.

5. The method according to claim 1, wherein the event occurrence is a step event detected based on dynamic state selection.

6. The method according to claim 1, wherein, based upon the event occurrence being present, the method further comprises receiving, from the model interface, updated data comprising the at least one modeling function.

7. The method according to claim 1, wherein the solver interface is a differential algebraic solver.

8. The method according to claim 7, wherein the providing occurs for at least one of (i) a start of a simulation, (ii) after an event update, (iii) after more than a predetermined number of steps have occurred since the last event occurrence detection, (iv) when the solution has a convergence failure, and (v) when the solution is divergent.

9. The method according to claim 1, wherein the receiving, mapping, providing, detecting, receiving, and initiate rendering occurs in a simulation environment.

10. The method according to claim 1, wherein the solver interface is an external integrator.

11. The method according to claim 1, wherein the model interface is a hardware description language based interface.

12. The method according to claim 1, wherein the model interface is an object-oriented modeling language based interface.

13. A system for performing a simulation of a physical system by interfacing between a model interface of a physical system and a solver interface of a solver model, the system comprising:
- at least one data processor; and
- memory storing instructions which, when executed by the at least one data processor, result in operations comprising:
  - accessing a virtual object model of a physical object, the virtual object model having the model interface;
  - receiving, from a solver interface, data comprising at least one solver function;
  - mapping the at least one solver function to at least one modeling function;
  - providing, to a model interface, data comprising the at least one modeling function corresponding to the at least one solver function;
  - detecting a presence of an event occurrence based on a plurality of interface functions, wherein the plurality of interface functions are mapped to the at least one solver function and the at least one modeling function;
  - providing, to the solver interface, the plurality of interface functions to determine a solution;
  - receiving, from the solver interface, the solution;
  - initiating rendering of the solution on a graphical user interface; and
  - wherein the physical object is created or modified based at least in part on the solution.

14. The system according to claim 13, wherein the physical system modeled by the model interface is either (i) an integrated circuit having at least one of an analog signal and a digital signal or (ii) a complex system having at least one of a mechanical subcomponent, an electrical subcomponent, a hydraulic subcomponent, a thermal subcomponent, or a controller subcomponent.

15. The system according to claim 13, wherein the event occurrence is a time event determined based on a predetermined time event point.

16. The system according to claim 13, wherein the event occurrence is a state event detected based on signal discontinuity of continuous states signaled by a sign change.

17. The system according to claim 13, wherein the event occurrence is a step event detected based on dynamic state selection.

18. The system according to claim 13, wherein, based upon the event occurrence being present, the method further comprises receiving, from the model interface, updated data comprising the at least one modeling function.

19. The system according to claim 13, wherein the solver interface is a differential algebraic solver.

20. An article of manufacture for performing a simulation of a physical system by interfacing between a modeling interface and a solving interface, the article of manufacture comprising:
- memory storing instructions which, when executed by the at least one data processor, result in operations comprising:
  - accessing a virtual object model of a physical object, the virtual object model having the model interface;
  - receiving, from a solver interface, data comprising at least one solver function;
  - mapping the at least one solver function to at least one modeling function;
  - providing, to a model interface, data comprising the at least one modeling function corresponding to the at least one solver function;
  - detecting a presence of an event occurrence based on a plurality of interface functions, wherein the plurality of interface functions are mapped to the at least one solver function and the at least one modeling function;
  - providing, to the solver interface, the plurality of interface functions to determine a solution;
  - receiving, from the solver interface, the solution; and
  - initiating rendering of the solution on a graphical user interface;
  - wherein the physical object is created or modified based at least in part on the solution.

* * * * *